(12) United States Patent
Pelt et al.

(10) Patent No.: US 7,848,114 B1
(45) Date of Patent: Dec. 7, 2010

(54) BALLAST HOUSING WITH AN INTEGRAL CIRCUIT BOARD GROUNDING DEVICE

(75) Inventors: James Van Pelt, Schaumburg, IL (US); David McCarty, Madison, AL (US); J. C. Kelley, Owens Crossroads, AL (US)

(73) Assignee: Universal Lighting Technologies, Inc., Madison, AL (US)

( * ) Notice: Subject to any disclaimer, the term of this patent is extended or adjusted under 35 U.S.C. 154(b) by 865 days.

(21) Appl. No.: 11/605,926

(22) Filed: Nov. 29, 2006

Related U.S. Application Data

(60) Provisional application No. 60/740,313, filed on Nov. 29, 2005.

(51) Int. Cl.
*H05K 9/00* (2006.01)

(52) U.S. Cl. ............... 361/753; 361/799; 361/800; 361/816; 361/818; 174/350; 174/377

(58) Field of Classification Search ............ 361/753, 361/799, 800, 816, 818; 174/350, 377
See application file for complete search history.

(56) References Cited

U.S. PATENT DOCUMENTS 3,258,649 A * 6/1966 Arguin et al. ............ 361/807
4,002,953 A * 1/1977 Tetlie ..................... 361/756
5,446,617 A * 8/1995 Blocher et al. ........... 361/674
5,880,937 A * 3/1999 Schadhauser et al. ...... 361/794
6,937,475 B2 * 8/2005 Rigimbal et al. .......... 361/752

* cited by examiner

*Primary Examiner*—Dameon E Levi
(74) *Attorney, Agent, or Firm*—Waddey & Patterson, PC; Mark J. Patterson

(57) ABSTRACT

An electronic ballast and ballast housing having an integral ground for a circuit board positioned within the housing. A 'snap in' capture means holds circuit board under flexion so as to press a circuit grounding means in electrical contact with an integral grounding device attached to the ballast housing and providing electrical continuity between the circuit grounding means and the ballast housing. The coupler includes a grounding tab with a fulcrum extension extending from the housing and holding a ground plane surface of the circuit board by means of serrated teeth. An alignment tab disposed on a housing wall receives an alignment slot disposed in the circuit board so as to provide proper alignment of the electrical contacts. The coupler includes an overhead extension that engages a jumper wire in the circuit of the circuit board.

17 Claims, 7 Drawing Sheets

BALLAST HOUSING WITH AN INTEGRAL CIRCUIT BOARD GROUNDING DEVICE

CROSS-REFERENCES TO RELATED APPLICATIONS

This application is a Non-Provisional Utility application which claims benefit of U.S. Patent Application Ser. No. 60/740,313 filed Nov. 29, 2005, entitled "Integral PCB Grounding To Metal Ballast Housing" which is hereby incorporated by reference it its entirety.

All other patents, patent applications, and publications described or discussed herein are hereby incorporated by reference in their entireties.

BACKGROUND OF THE INVENTION

The present invention relates generally to electronic ballasts. More particularly, the current invention relates to ballasts and ballast housings having an integral ground for a circuit board positioned within the ballast housing.

Ballast housings having electronic components, including circuit boards, positioned in the housings are well known in the art. These circuit boards are normally attached by screws or other fasteners to the metal housing and include a soldered, insulated lead wire extending from the plane of the circuit board and connected to a slot, or opening, in the canned portion of the metal housing. This lead wire is usually stripped to bare wire at the point it is connected to the metal can.

This type of grounding for circuit boards taught by the prior art has several disadvantages, including the need to maintain a separate wiring inventory for each component that goes into the ballast housing. There are also additional manufacturing labor costs associated with the soldering the lead wire to the circuit board and then soldering or fastening the other end of the lead wire to the housing. Injuries to workers assembling circuit boards in the ballast housings are associated with the prior art installation process. Additionally, the soldered connections and fastener connections between the lead wire and the circuit board and between the lead wire and the ballast housing are more susceptible to manufacturing defects because of the manual or semi-automated processes associated with assembling the ballast of the prior art and are a common failure point in the electrical circuit in which the circuit board is operating.

For example, the prior art uses both soldered connections and screw type fasteners in assembling the ballast. Both fastening means requires multiple steps and slows the installation process of mounting the circuit board into the ballast housing, thus increasing per unit labor costs and reducing throughput. The solder components and screw type fasteners must also be maintained and controlled as separate inventory items, which further increases manufacturing overhead costs. Both soldered connections and screw type fasteners are associated with circuit failures. These disadvantages in the design of prior art ballast housings create additional costs in the manufacture of the ballast housing, as well as increase safety issues during the assembly of the ballast housing.

What is needed, then, is a ballast housing having features that are integral to the housing and that receive and secure a circuit board within the housing and provide electrical continuity between a grounding means disposed on the circuit board and the housing without the need of installing separate lead wires. This needed ballast housing would most desirably include a quick assembly, 'snap in' connection between the printed circuit board, the ballast housing, and the integral grounding device.

BRIEF SUMMARY OF THE INVENTION

The present invention is directed toward an electronic ballast having a ballast housing in electrical communication with an electrically conductive coupler integrally installed upon or formed in the housing. A circuit board having a resilient substrate, an electrical circuit, and a circuit grounding means is disposed within the housing. The circuit grounding means includes at least one of a circuit extension spanning above the substrate and a ground surface disposed upon the substrate. The coupler receives at least one of the circuit extension and the ground plane surface such that the coupler provides electrical continuity from the circuit, to the ballast housing by means of a one circuit grounding means and the coupler. A snap-in capture means holds the circuit board resilient substrate under flexion and presses the circuit grounding means against the integral grounding means so as to provide an electrical ground circuit between the circuit grounding means and the ballast housing. Advantageously, neither solder connections nor screw type fasteners comprise any of the electrical connections between the circuit grounding means and the ballast housing.

In one embodiment, the coupler has a vertical alignment tab attached to a proximal end wall of the housing and a grounding tab attached to the floor wall of the housing. The grounding tab has a fulcrum extension with an engagement means, such as a serrated surface, for engaging and holding the ground plane surface of the circuit board. Each circuit board adapted for installation into the ballast housing has an alignment slot in one proximal end which is placed around the alignment tab of the coupler to ensure proper alignment and installation of the circuit board in the housing so as to engage and electrically connect a circuit extension or a ground plane surface with the coupler. The ballast housing has at least one shear tab and at least one gusset cooperating to receive and hold the distal end of the circuit board. The coupler and the ballast housing are each at least partially formed from electrically conductive material such that the coupler is electrically connected to the housing. Thus, the coupler provides a grounding circuit connecting the circuit board to the housing without soldered connections or fastner connections.

In a first preferred embodiment, the coupler includes an overhead extension having a hook extension for receiving the circuit extension or jumper wire in a jumper wire seat. The hook extension engages the substrate of the circuit board thereby cantilevering the proximal end of the circuit board over the fulcrum extension. The shear tab engages the distal end of the substrate of the circuit board thereby cantilevering the circuit board over the gusset. The hook extension and the shear tab each provide a downward force on opposite ends of the resilient substrate and the fulcrum extension and the gusset provide an upwards force on the respective ends of the resilient substrate. In a preferred embodiment the fulcrum extension and the gusset are longitudinally offset inward of the hook extension and the shear tab, respectively. When installed in the ballast housing, the circuit board is held tightly in opposing cantilevered force between coupler and the shear tab, which engage the upper face of the circuit board, and the offset fulcrum extension and gusset, which engage the lower surface of the circuit board. These support structures of the ballast housing comprise the snap-in capture means of this first preferred embodiment and provide a pressure fit engagement between a circuit board positioned in the housing and support structures of the housing. Thus, the coupler restricts the movement of the circuit board relative to the ballast housing and provides electrical continuity between the electrical circuit of the circuit board and the ballast housing.

In a second preferred embodiment, the coupler includes at least one shear tab formed in the proximal end wall in lieu of an overhead extension of the first embodiment. In this second embodiment, the grounding tab additionally includes a yoke riser having a yoke cut out that, with the circuit board installed in the ballast housing, extends above the upper surface of the circuit board and engages the circuit extension or jumper wire. The circuit board alignment slot may be sized to provide a space for the yoke riser to extend through the circuit board or, alternately, a separate hole may be formed in the circuit board for the same purpose. When installed in the ballast housing, the circuit board is held tightly in opposing cantilevered force between the shear tabs of the proximal end wall and the distal wall, which engage the upper face of the circuit board, and the offset fulcrum extension and gusset, which engage the lower surface of the circuit board. These support structures of the ballast housing comprise the snap-in capture means of this second preferred embodiment and provide a pressure fit engagement between a circuit board positioned in the housing and support structures of the housing. Thus, the coupler of this second embodiment also restricts the movement of the circuit board relative to the ballast housing and promotes electrical engagement between the electrical circuit and the ballast housing.

The ballast housing and coupler are at least partly constructed from electrically conductive materials, such as aluminum, and provide a grounding circuit for the circuit board by means of the ground plane surface, the serrated teeth of the fulcrum extension, grounding tab and the housing which form a continuous circuit. Alternately or in addition, the grounding circuit is provided by means of the jumper wire, the hook extension, the overhead extension and the housing which form a second continuous circuit. Another alternate grounding circuit is provided by means of the jumper wire, the yoke riser of the fulcrum extension, grounding tab and the housing forming a continuous circuit. Thus, the electrode coupler forms an integral grounding device for a circuit board positioned in the housing.

Accordingly, it is an object of the present invention to provide a ballast housing having an integral grounding device for a circuit board positioned in the housing.

Another object of the present invention is to provide a ballast housing that provides a grounding circuit that is internal to the housing for a circuit board positioned therein.

Still another object of the present invention is to provide a ballast housing that eliminates the need for an opening cut in the housing for grounding of electronic devices positioned in the housing.

Still another object of the present invention is to provide a ballast housing having a pressure fit engagement between a circuit board positioned in the housing and structures of the housing.

Yet still another object of the present invention is to provide a method for assembling an electronic ballast that utilizes the resilient force, generated after the substrate has been positioned, and deformed, in the ballast housing, to ensure electrical continuity between the circuit and the ballast housing and also to restrict the movement of the substrate relative to the ballast housing.

These and other and further objects, features and advantages of the present invention will be readily apparent to those skilled in the art upon reading of the following disclosure, and are satisfied by the present invention of a ballast housing having an integral circuit board grounding.

DETAILED DESCRIPTION OF THE INVENTION

First Preferred Embodiment

Figure 1:
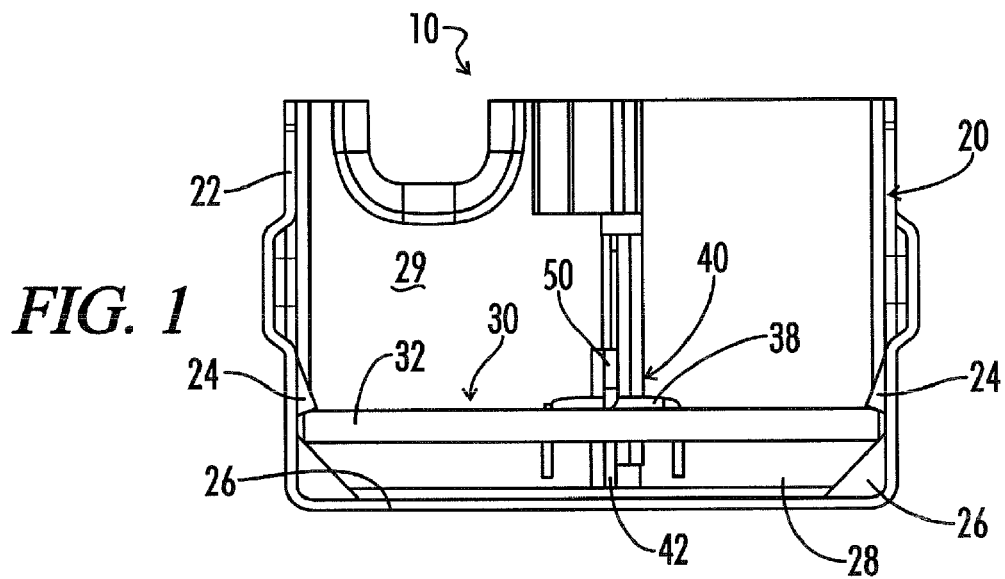
FIG. 1 is a cross-sectional end view of one preferred embodiment of this invention and shows a circuit board positioned in a ballast housing.
Figure 2:
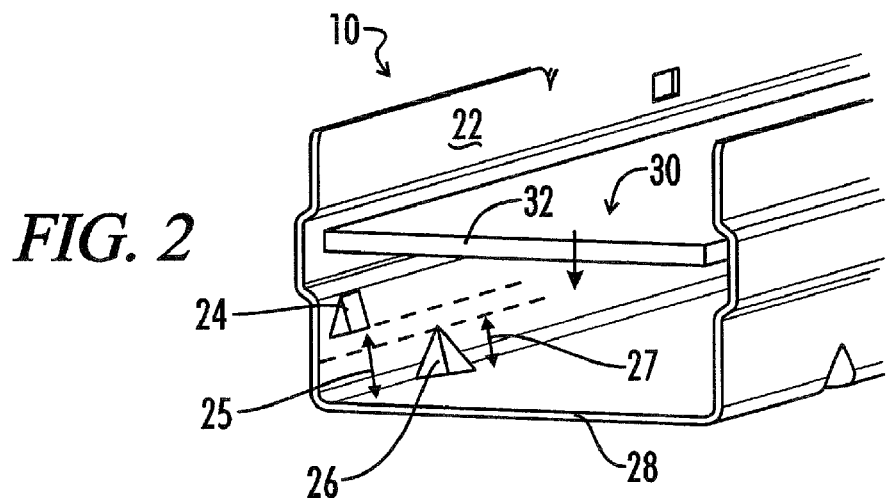
FIG. 2 is an oblique end view of the embodiment of FIG. 1 showing a circuit board being inserted into a ballast housing.
Figure 3:
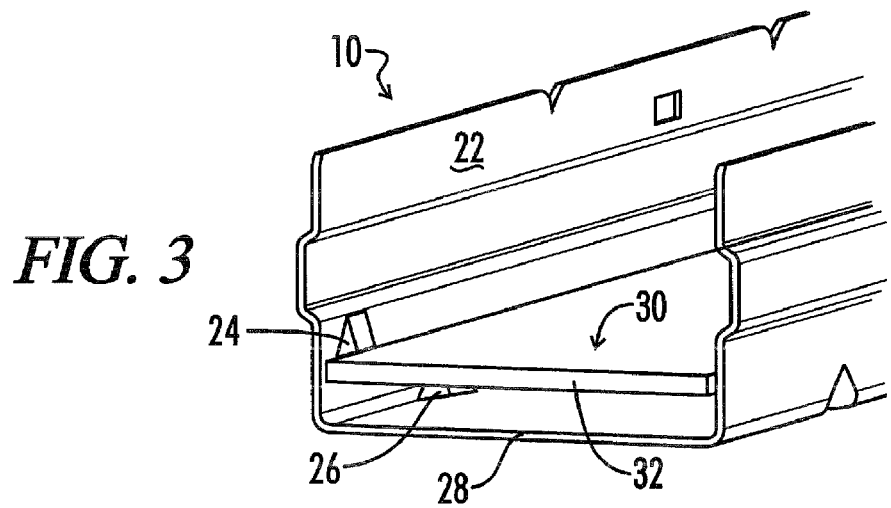
FIG. 3 is an oblique end view of the embodiment of FIG. 1 showing a circuit board fixed in position in a housing a ballast housing.
Figure 4:
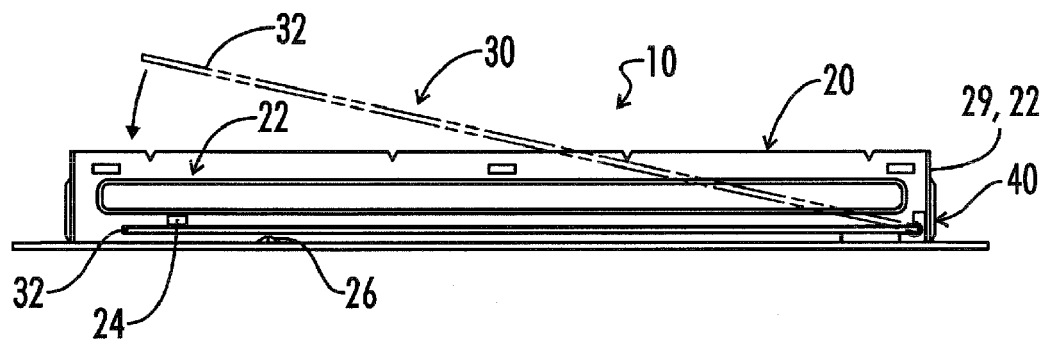
FIG. 4 is a cross-sectional longitudinal view of the embodiment of FIG. 1 showing a circuit board positioned in a ballast housing and further showing in relief a circuit board being inserted into a ballast housing.

One preferred embodiment of the electronic ballast of present invention is shown in FIGS. 1-8. FIG. 1 shows a cross-sectional end view of an electronic ballast 10 having a circuit board 30 installed in a ballast housing 20. FIG. 4 shows a cross-sectional longitudinal view of an electronic ballast 10 having a circuit board 30 installed in a ballast housing 20. The remaining figures show details of the structure of this preferred embodiment as well as illustrate the method of instillation of the circuit board 30 into the ballast housing 20.

Figure 6:
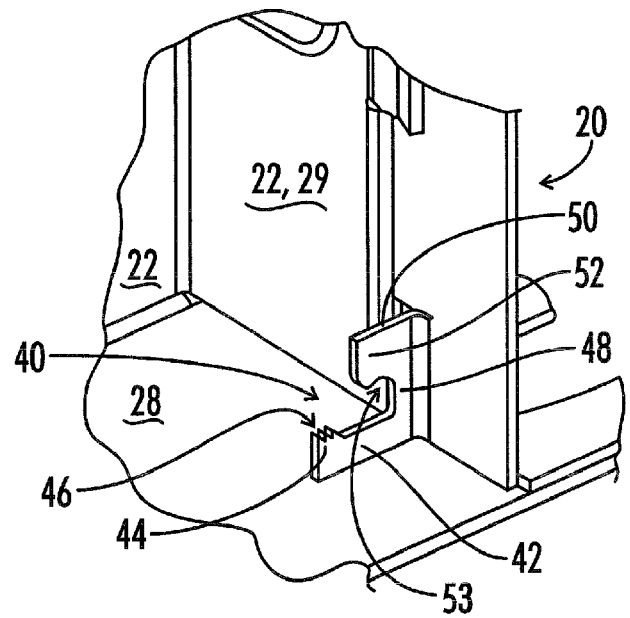
FIG. 6 is a cross-sectional longitudinal view of the embodiment of FIG. 2.
Figure 7:
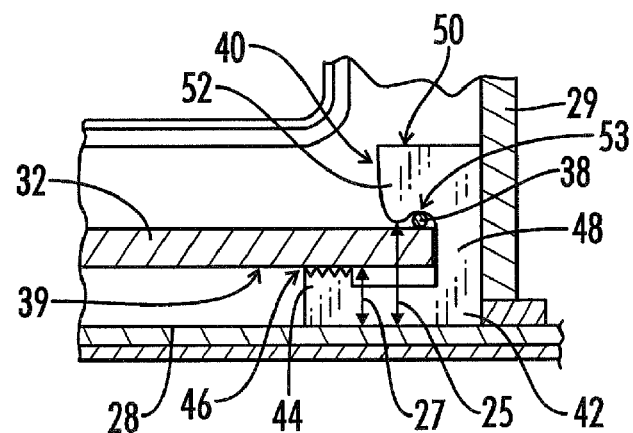
FIG. 7 is a detailed view in oblique perspective of a circuit board used in the embodiment of FIG. 1.
Figure 8:
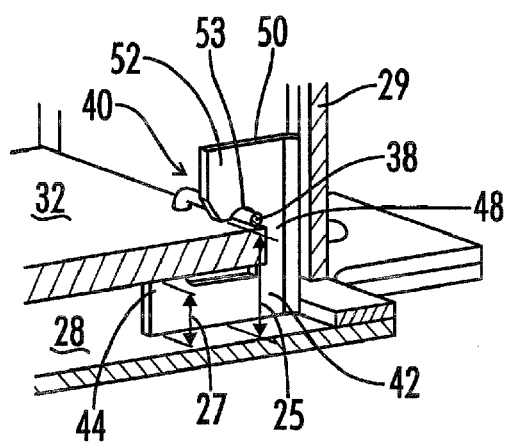
FIG. 8 is a detailed view in oblique longitudinal perspective of the ballast housing of the embodiment of FIG. 4.

Referring to drawing details shown in FIGS. 6-8, the ballast housing 20 includes an electrode coupler 40 integrally disposed upon a floor wall 28 and upon a proximal end wall 29 of the housing 20. The electrode coupler 40 of this preferred embodiment includes an alignment tab 48 and an overhead extension 50 extending from the proximal end wall 29 and further includes a grounding tab 42 extending from the floor wall 28. In one preferred embodiment, these three portions are formed integral to one another and then integrally affixed to the ballast housing. For example, the electrode coupler may be formed by stamping a coupler from a single metal plate and then affixing the coupler to the ballast. In alternate embodiments, one or more of the alignment tab, the overhead extension or the grounding tab may be separately formed and then affixed to the ballast housing so as to be offset along the proximal end wall, floor wall or an adjacent side wall. In other alternate embodiments, at least a portion of the housing and the coupler are cast as a single unit. In yet other alternate embodiments, the grounding tab may be disposed above the upper surface of the circuit board substrate and affixed to an end wall or side wall. Other methods of making and assembling the coupler within the housing would be obvious to one skilled in the arts and are encompassed by the present invention.

Referring again to FIGS. 6-8, the overhead extension 50 of a preferred embodiment includes a downward hook extension 52 disposed so as to engage the top surface of the substrate 32 of the circuit board 30 at a control elevation 25. The electrode coupler 40 also includes a grounding tab 42 having a fulcrum extension 44 portion extending upwards so as to engage the bottom surface of the substrate 32 at a support level 27. The fulcrum extension 44 includes an engagement means to engage the lower surface of a circuit board 30 when the board is installed in the ballast housing 20. In the embodiment shown in FIGS. 6-8, the engagement means are serrated teeth 30 formed in the top of the fulcrum extension 44 and adapted to engage and hold a ground surface 39 disposed on the lower surface of the circuit board 30. Other engagement means would be obvious to one skilled in the arts. The fulcrum extension 44 of the embodiment shown is positioned below and inward of the hook extension 52 so as to form a pivot point for cantilevering a circuit board 30 when it is installed in the electrode coupler 40 of the ballast housing 20.

Figure 5:
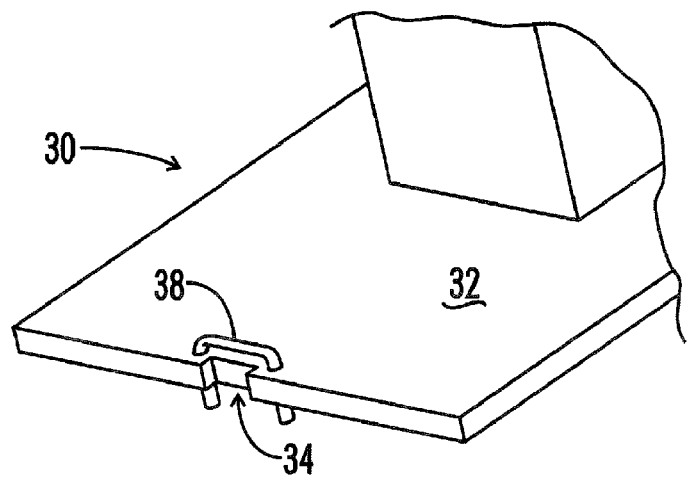
FIG. 5 is a detailed view in oblique longitudinal perspective of the embodiment of FIG. 4.

The circuit board 30 of one preferred embodiment of the present invention shown in FIGS. 1, 5 and 7 includes a circuit (not shown) disposed on a resilient substrate 32 having an alignment slot 34 formed in one end of the circuit board 30. The alignment slot 34 is adapted to receive the alignment tab 48 of the electrode coupler 40 when the circuit board 30 is being installed in the ballast housing 20. As shown in FIG. 5, a jumper wire 38 electrically coupled with the circuit is disposed adjacent the alignment notch 34 and extends along and above the surface of the substrate. As shown in FIGS. 7 and 8, the electrode coupler 40 further includes a jumper wire seat 53 disposed upon lower surface of the overhead extension 50 proximal to the hook extension 52. When the circuit board 30 is installed in the ballast housing 20, the jumper wire 38 is pressed between the substrate 32 and the jumper wire seat 53. The jumper wire seat 53 engages the jumper wire 38 so as to create an electrical connection therewith. In one preferred embodiment, the jumper wire 38 includes uninsulated wire at its point of contact with the jumper wire seat 53 so as to facilitate an electrical connection. At least a portion of the jumper wire seat 53, the overhead extension 50 and the proximal end wall 29 are formed of electrically conductive materials and provide a grounding circuit for the jumper wire 38 when the circuit board 30 is installed in the ballast housing 20.

In an alternate preferred embodiment, the jumper wire includes insulated wire at its point of contact with the jumper wire seat and the jumper seat is adapted to penetrate the insulation so as to form an electrical connection with the wire. In another alternate embodiment of the present invention the jumper wire seat is disposed in a notch in the hook extension. In yet other embodiments the jumper wire seat includes a 'snap in' type clip adapted to receive and retain the jumper wire. In this last embodiment, the jumper wire may span the alignment tab or some other penetration into the substrate of the circuit board. One skilled in the art will recognize that other known engagement means may be employed in the present invention to automatically receive, capture and electrically connect with the jumper wire to the housing as a result of the installation of the circuit board into the housing.

The circuit board 30 of the preferred embodiment shown in FIGS. 1, 5 and 7 further includes an electrically conductive ground surface 39 electrically coupled with the circuit and disposed upon the bottom surface of the substrate 32 adjacent to the alignment slot 34 so as to receive the engagement means of the grounding tab 42. In another embodiment of the present invention, the electrically conductive ground surface is disposed on the upper surface of the circuit board. In yet another embodiment of the present invention, the electrically conductive ground surface is disposed on an edge surface of the circuit board. In the embodiment shown in FIGS. 6-8, the serrated teeth 46 formed in the top of the fulcrum extension 44 engage and hold the ground surface 39 of the circuit board 30. At least a portion of the serrated teeth 46, the fulcrum extension 44, the grounding tab 42 and the floor wall 28 are formed of electrically conductive materials and provide a grounding circuit for the ground surface 39 when the circuit board 30 is installed in the ballast housing 20.

For the first preferred embodiment of the electronic ballast of present invention shown in FIGS. 1-8, FIGS. 4, 2 and 3 show the process of installing the circuit board 30 into the ballast housing 20. The alignment tab 48 fits into the alignment slot 34 and guides the substrate 32 into the proper alignment within the ballast housing 20. This alignment means provides a simple, effective means of guiding the substrate 32 into the housing 20. Proper location is important to ensure the grounding means of the circuit board 30 make contact with the grounding means of the ballast housing 20 to assure electrical connectivity between the circuit and the ballast housing 20.

As shown in FIG. 4, the end of the substrate 32 having the alignment slot 34 is inserted at an angle into the space between the hooked extension 52 and the fulcrum extension 44. The distal end of the substrate is pressed down to the point where the substrate 32 is slightly flexed about the fulcrum extension 44. The distal end of the substrate 32 is then fixed in position by a capture means such that the substrate 32 remains slightly flexed between the point of contact with the fulcrum extension 44 and the overhead extension 50.

As shown in FIGS. 2 and 3, the capture means of this first preferred embodiment includes two pairs of gussets 26 and shear tabs 24, each integrally formed into the ballast housing 20. The distal end of the substrate 32 is fixed to the ballast housing 20 when captured by at least one pair of gussets 26 and shear tabs 24, as shown in FIG. 3. For each pair, the shear tab 24 catches the top surface of the substrate 32 and the gusset 26 supports the bottom surface of the substrate 32. The shear tab 24 is adapted to engage the upper surface of the substrate 32 at a control elevation 25. When the substrate 32 is pushed down about the fulcrum extension 44 to engage the shear tab 24, the gusset 26 engages and supports the bottom surface of the substrate at a support elevation 27. The gusset 26 is located below and inward of the shear tab 24. The support elevation 27 is high enough that the substrate must be flexed about the point of contact with the gusset 26 to engage the shear tab 24, so that the gusset 26 creates a fulcrum for the substrate 32 near the distal end of the ballast housing 20.

The substrate 32 is held in a flexed position by contact on the upper surface with the hook extension 52 on one end and with the shear tab 24 on the other end, as shown in FIG. 4. The bottom surface of the substrate 32 is then flexed or cantilevered upwards by the fulcrum extension 44 on one end, and the gusset 26 on the opposite end. The fulcrum extension 44 and the gusset 26 under the substrate 32 are closer to the center of the substrate 32 than the top support members of the hook extension 52 and the shear tab 24, respectively, so that the substrate 32 is deformed into a slightly bowed position. This cantilevering effect of the ballast housing capture means, combined with the resilient flexion of the substrate 32, provides constant pressure by the ballast housing capturing means upon the substrate 32 so as to fixedly hold the circuit board 30 within the ballast housing 10 without the use of common fasteners. The capture means of the preferred embodiment shown in FIGS. 1-8 includes the hook extension 52 and the shear tab 24, which engage the upper surface of the substrate 32, and the fulcrum extension 44 and the gusset 26, which engage the lower surface of the substrate 32. The flexed, cantilevered position of the substrate 32 results in a pressure fit engagement between the capture means and the circuit board 30. This prevents movement of the circuit board 30 with respect to the ballast housing 20 and ensures a rigid engagement of the electrode coupler 40 with the jumper wire 38 and the ground surface 39 of the circuit board 30 without the use of either solder connections or fastener connections.

Second Preferred Embodiment

Figure 9:
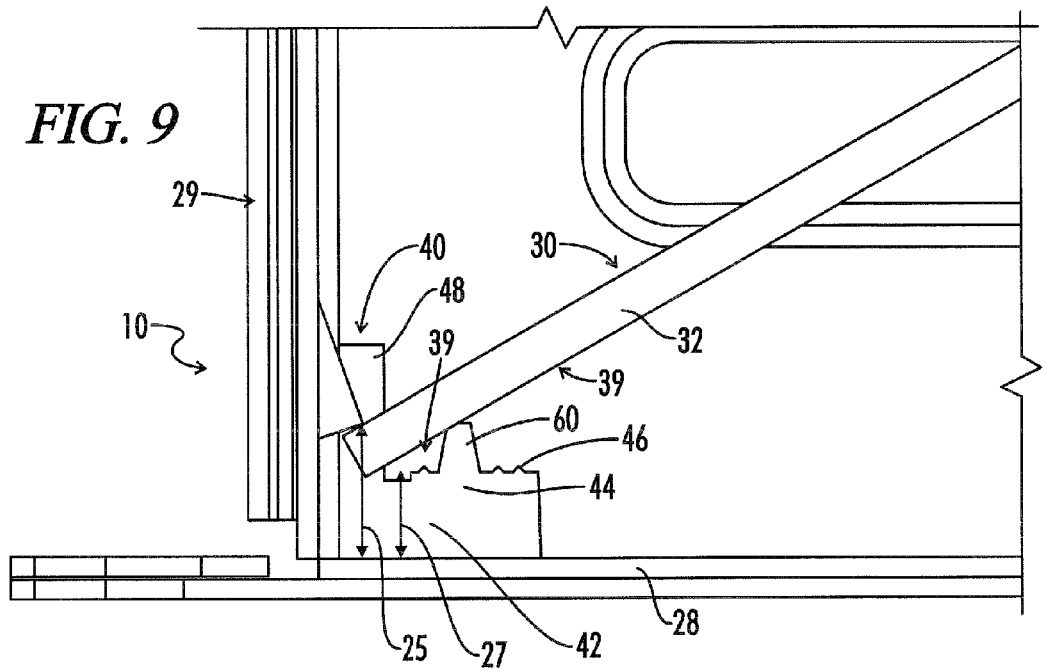
FIG. 9 is a detailed view in longitudinal perspective of a circuit board being positioned in a ballast housing of a second preferred embodiment of the invention.
Figure 10:
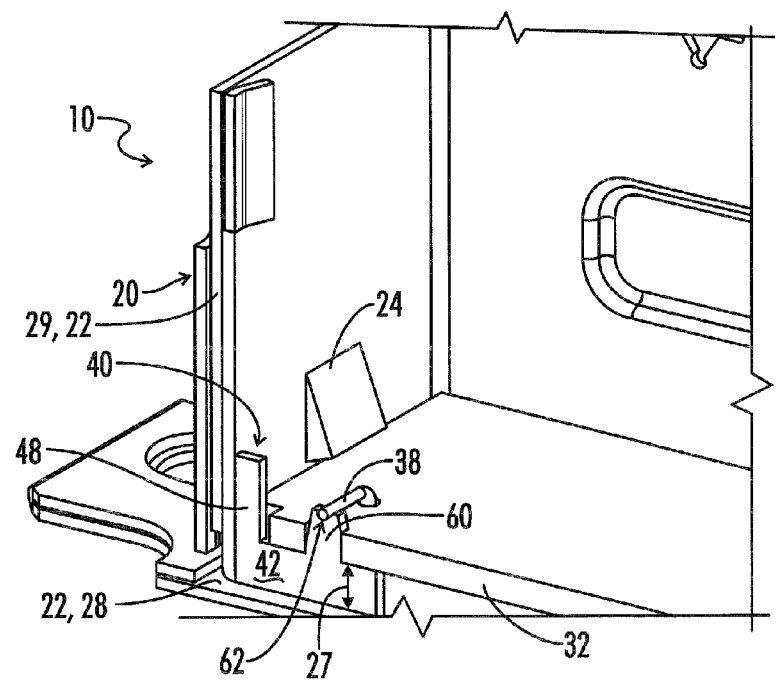
FIG. 10 is a detailed view in oblique longitudinal perspective of the embodiment of FIG. 9 showing a circuit board positioned in a ballast housing.
Figure 11:
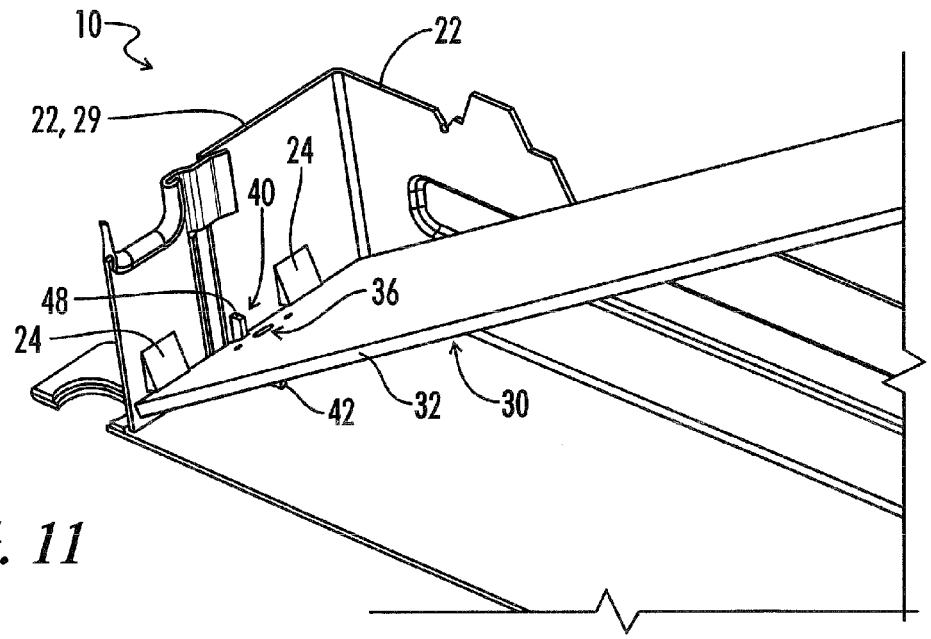
FIG. 11 is a detailed oblique view in longitudinal perspective of a circuit board being positioned in a ballast housing of the embodiment of FIG. 9.
Figure 12:
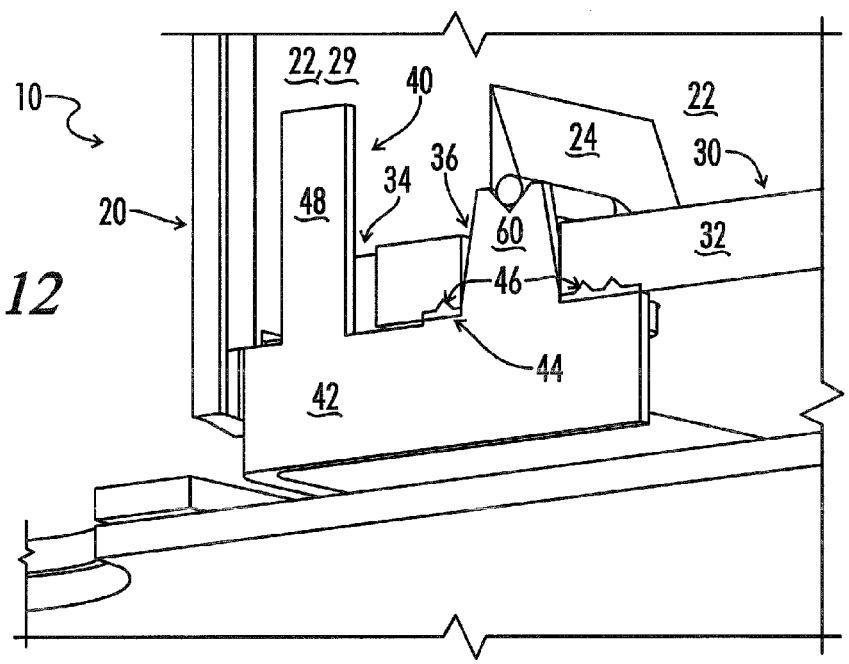
FIG. 12 is a detailed view in oblique longitudinal perspective of the embodiment of FIG. 9 showing a circuit board positioned in a ballast housing coupler.
Figure 13:
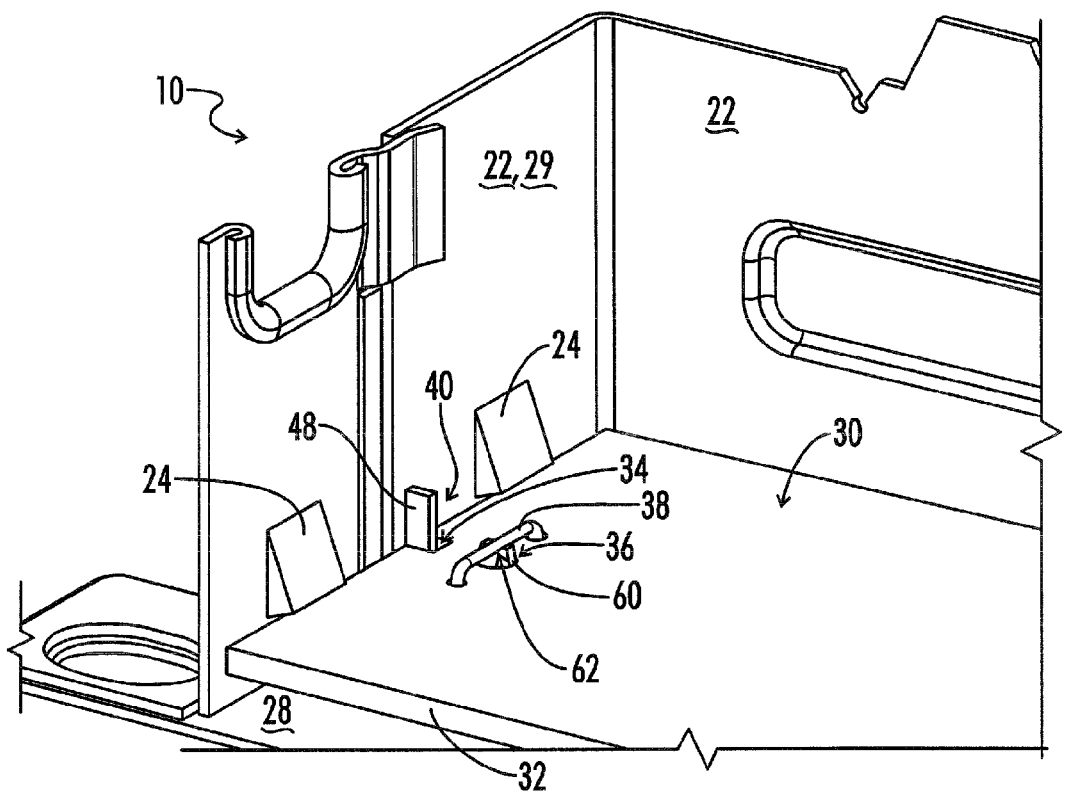
FIG. 13 is a second detailed view in oblique longitudinal perspective of the embodiment of FIG. 9 showing a circuit board positioned in a ballast housing coupler.

A second preferred embodiment of the electronic ballast 10 of the present invention is generally described in FIGS. 9-15 and includes a circuit card 30 installed in a ballast housing 20. The circuit card 30 of this embodiment incorporates features common with the first preferred embodiment, including an alignment slot 34 disposed in an end of the substrate 32, a jumper wire 38 and a ground surface 39, except that the jumper wire 38 spans a yoke hole 36 or, alternately, spans an alignment slot (not shown). The ballast housing 20 of this embodiment incorporates features common with the first preferred embodiment, including an alignment tab 48 affixed to a proximal end wall 29, a grounding tab 42 with fulcrum extension 44 and engagement means affixed to the floor wall 28 and distal pairs of shear tabs 24 and gussets 26 integrally formed with the ballast housing walls 22 as described above. As shown in FIGS. 10 and 12, the electrode coupler 40 of this second preferred embodiment includes a yoke riser 60 having a yoke cut out 62. The overhead extension and hook extension of the first embodiment are omitted in this second embodiment. The yoke riser 60 extends from the grounding tab 42 above the fulcrum extension 44. In the preferred embodiment shown, the yoke riser 60 extends through a yoke hole 36 in the substrate 32 above the upper surface of the substrate 32 so as to receive the jumper wire 38 that is electrically connected to the circuit of the circuit board 30. In an alternate preferred embodiment, the alignment slot 34 includes the yoke hole 36.

In this second preferred embodiment, the yoke cut out 62 is disposed upon the yoke riser 60 and provides a seat for engaging and retaining the jumper wire 38. The yoke riser 60 and yoke cut out 62 are sized so as to exert sufficient tension upon the jumper wire 38 as to hold the jumper wire 38 firmly within the yoke cut out 62. In one preferred embodiment, the jumper wire 38 includes uninsulated wire at its point of contact with the yoke cut out 62 so as to facilitate an electrical connection. At least a portion of the yoke riser 60, the grounding tab 42 and the floor wall 28 are formed of electrically conductive materials and provide a grounding circuit for the jumper wire 38 when the circuit board 30 is installed in the ballast housing 20.

In an alternate preferred embodiment, the jumper wire includes insulated wire at its point of contact with the yoke cut out and the yoke cut out is adapted to penetrate the insulation so as to form an electrical connection with the wire. In other embodiments the yoke riser includes a 'snap in' type clip adapted to receive and retain the jumper wire. One skilled in the art will recognize that other known engagement means may be employed in the present invention to automatically receive, capture and electrically connect with the jumper wire to the housing as a result of the installation of the circuit board into the housing.

As with the first preferred embodiment and described above, an electrically conductive ground surface 39 of the circuit card 30 of the second preferred embodiment is electrically coupled with the circuit and disposed upon a bottom surface of the substrate 32. Serrated teeth 46 of a fulcrum extension 44 engage and hold the ground surface 39. At least a portion of the serrated teeth 46, the fulcrum extension 44, the grounding tab 42 and the floor wall 28 are formed of electrically conductive materials and provide a grounding circuit for the ground surface 39 when the circuit board 30 is installed in the ballast housing 20.

Alternate embodiments of the electrode coupler include a yoke riser separate from the grounding tab and fulcrum extension. In one such alternate embodiment, the yoke riser is displaced along the floor wall from the grounding tab. In this embodiment the yoke hole and the alignment slot in the substrate of the circuit board are displaced relative to each other so that they are no longer adjacently disposed as in the first preferred embodiment. In this alternative embodiment, the yoke riser is displaced from the grounding tab and alignment tab so as to be disposed beneath the yoke hole. The yoke riser is affixed to the floor wall at a point beneath the yoke hole and extends through the yoke hole so as to engage a jumper wire. In other alternate embodiments, the alignment tab, the grounding tab and the yoke riser are each disposed separate from the others. One skilled in the art will recognize that other arrangements of the alignment tab, the grounding tab and the yoke riser may be employed in the present invention to automatically receive, capture and electrically connect the jumper wire to the housing or to automatically receive, capture and electrically connect the grounding surface to the housing as a result of the installation of the circuit board into the housing.

Referring now to FIGS. 9-12, the capture means of the ballast housing 20 of the second preferred embodiment is shown having at least one shear tab 24 disposed on the proximal end wall 29 of the ballast housing 20 in lieu of the overhead and hook extensions of the first embodiment.

Figure 14:
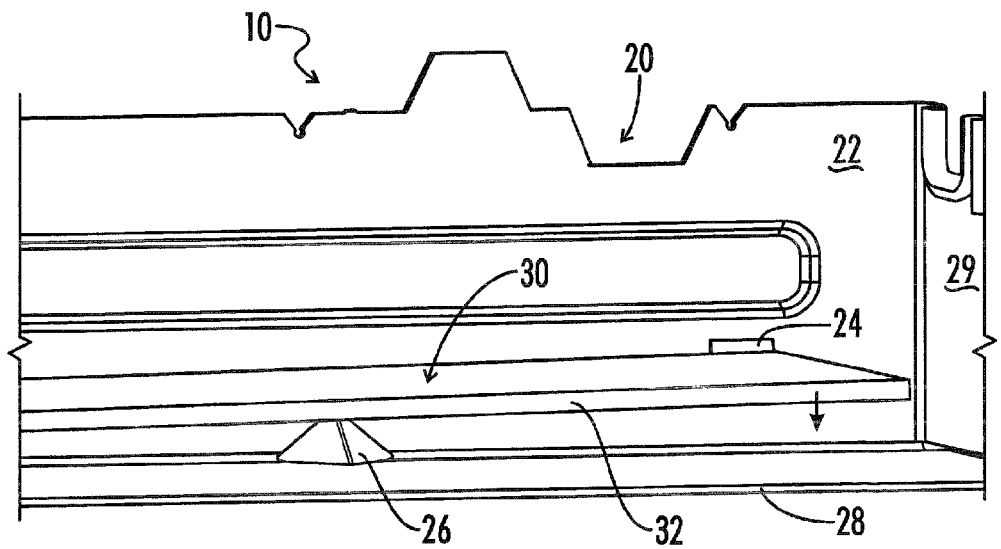
FIG. 14 is a detailed cross-sectional view of the embodiment of FIG. 9 showing positioning of the distal end of the circuit board immediately before engagement with the shear tab and gusset.

FIGS. 9, 11 and 14 show the process of installing the circuit board 30 into the ballast housing 20 of the second preferred embodiment of the electronic ballast of present invention, which is shown generally in FIGS. 9-15. As with the first embodiment, alignment tab 48 fits into the alignment slot 34 and guides the substrate 32 into the proper alignment within the ballast housing 20. As shown in FIGS. 9 and 11, the capture means of this second preferred embodiment includes two proximal shear tabs 24 each integrally formed into the proximal end wall 29 of the ballast housing 20 and disposed above the fulcrum extension 44 of the grounding tab 42. The capture means further includes two distal pairs of gussets 26 and shear tabs 24 integrally formed into the distal portion of the ballast housing 20.

Figure 15:
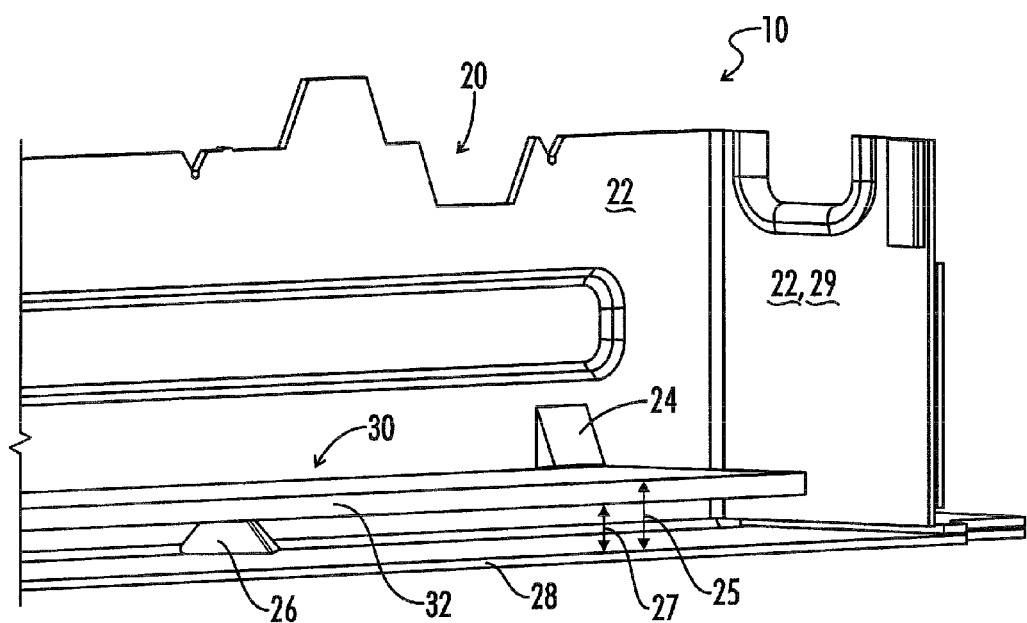
FIG. 15 is a detailed cross-sectional view of the embodiment of FIG. 9 showing the distal end of the circuit board engaged with the shear tab and gusset.

As shown in FIG. 9, the proximal end of the substrate 32 having the alignment slot 34 is inserted at an angle into the space between the proximal shear tabs 24 and the fulcrum extension 44. The distal end of the substrate is pressed down to the point where the substrate 32 is slightly flexed about the fulcrum extension 44. As shown in FIGS. 9 and 10, the proximal shear tabs 24 are adapted to engage the upper surface of the substrate 32 at a control elevation 25 and the fulcrum extension 44 engages and supports the bottom surface of the substrate at a support elevation 27. The distal end of the substrate 32 is then fixed in position by two distal pairs of gussets 26 and shear tabs 24 such that the substrate 32 remains slightly flexed between the point of contact with the fulcrum extension 44 and the proximal shear tabs 24. As shown in FIGS. 14 and 15, the distal end of the substrate 32 is fixed to the ballast housing 20 when captured by at least one pair of gussets 26 and shear tabs 24. For each pair, the shear tab 24 catches the top surface of the substrate 32 and the gusset 26 supports the bottom surface of the substrate 32. As shown in FIGS. 14 and 15, each shear tab 24 is adapted to engage the upper surface of the substrate 32 at a control elevation 25. When the substrate 32 is pushed down about the fulcrum extension 44 to engage the shear tab 24, the gusset 26 each engages and supports the bottom surface of the substrate at a support elevation 27. The gusset 26 is located below and inward of the distal shear tab 24. The support elevation 27 is high enough that the substrate must be flexed about the point of contact with the gusset 26 to engage the shear tab 24, so that the gusset 26 creates a fulcrum for the substrate 32 near the distal end of the ballast housing 20.

The substrate 32 is held in a flexed position by contact on the upper surface with proximal shear tabs 24 on the proximal end and with the distal shear tabs 24 on the distal end, as shown in FIGS. 10 and 15. The bottom surface of the substrate 32 is then flexed or cantilevered upwards by the fulcrum extension 44 on the proximal end, and the gusset 26 the distal end. The fulcrum extension 44 and the gusset 26 under the substrate 32 are closer to the center of the substrate 32 than their corresponding the shear tabs 24, so that the substrate 32 is deformed into a slightly bowed position. This cantilevering effect of the ballast housing capture means of the second preferred embodiment is analogous to that of the first preferred embodiment as described above. The flexed, cantilevered position of the substrate 32 results in a pressure fit engagement between the capture means and the circuit board 30. This prevents movement of the circuit board 30 with respect to the ballast housing 20 and ensures a rigid engagement of the electrode coupler 40 with the jumper wire 38 and the ground surface 39 of the circuit board 30 without the use of either solder connections or fastener connections.

Advantageously, the ballast housing of the present invention provides an integral ground for the circuit board when the circuit board is simply inserted into the ballast housing so as to be captured by the capture means without the necessity of any further assembly action. The prior art practice of further assembling a ground by fastening or soldering a circuit board grounding wire to a slot in the ballast housing after assembly is eliminated.

Alternate embodiments of the present invention include engagement means disposed upon the lower surface of a shear tab or the upper surface of a gusset so as to engage a circuit grounding means such as a circuit extension or ground plane surface disposed over or upon the substrate of a circuit board installed in the ballast housing. In these alternate embodiments the shear tab or gusset includes a conductive material that provides a grounding path to the ballast housing.

The snap-in capture means of embodiments of the present invention described above have included various elements of the electrode coupler and shear tabs and gussets installed upon or form from the walls of the ballast housing. Other snap-in capture means are be incorporated into yet alternate embodiment of the present invention and include resilient latches, clips and grips disposed in the housing so as to receive and hold the substrate of a circuit board in flexion against the integral grounding means. Yet other snap-in capture means include recesses, ledges and overhangs formed in the walls of the housing. One skilled in the art will recognize other obvious snap-in capture means that are encompassed by the present invention.

Thus, although there have been described particular embodiments of the present invention of a new and useful Ballast Housing With An Integral Circuit Board Grounding Device, it is not intended that such references be construed as limitations upon the scope of this invention except as set forth in the following claims.

What is claimed is:

1. An electronic ballast housing comprising:
   a plurality of walls defining a region for housing a circuit board comprising a circuit disposed upon a substrate, the circuit including a circuit grounding means;
   an electrically conductive integral grounding means disposed upon at least one of the plurality of walls including at least one electrically conductive wall;
   wherein the integral grounding means is adapted to engage the circuit grounding means in electrical contact upon insertion of the circuit board into the ballast housing so as to provide electrical continuity between the circuit grounding means and the ballast housing;
   an alignment means disposed upon at least one of the plurality of walls and adapted to provide alignment of the circuit card during installation;
   a capture means disposed upon at least one of the plurality of walls, wherein upon insertion of the circuit board in the ballast housing the capture means is adapted to receive and fixedly hold in flexion at least a portion of the substrate so as to control the circuit grounding means of the circuit board in electrical contact with the integral grounding means;
   wherein the circuit grounding means comprises a jumper wire extending across a cavity disposed through the substrate;
   wherein the integral grounding means further comprises a yoke riser having the second engagement means disposed thereon and extending from one of the plurality of walls; and
   wherein with the circuit board installed in the ballast housing, the yoke riser is further adapted to extend through the cavity, and wherein, the second engagement means engages the jumper wire in electrical contact so as to provide electrical continuity between the jumper wire and the ballast housing.

2. The ballast housing of claim 1, wherein the circuit grounding means comprises a jumper wire extending across the second side of the substrate; and
   wherein the integral grounding means further comprises the second engagement means disposed upon an electrically conductive overhead tab disposed upon one of the plurality of walls and, with the circuit board installed in the ballast housing, extending above the second side of the substrate, the second engagement means receiving and holding the jumper wire in electrical contact, the second engagement means and the overhead tab adapted so as to provide electrical continuity between the jumper wire and the ballast housing.

3. The ballast housing of claim 2, wherein the grounding tab further comprises a fulcrum extension adapted to support the first engagement means so as to control the ground surface at a first support distance from the first wall,
- wherein the capture means comprises a plurality of support structures disposed upon the plurality of walls, the plurality of support structures including the fulcrum extension and further including a proximal anchor means disposed upon a second wall proximate the fulcrum extension and adapted to receive and hold a proximal portion of a second side of the substrate so as to control the proximal portion of the second side at a first capture distance from the first wall, and
- wherein the first capture distance and the first support distance are selected so as to cause the substrate to cantilever over the fulcrum extension so as to be fixedly held in flexion against the proximal anchor means and the fulcrum extension.

4. The ballast housing of claim 3, wherein the plurality of support structures further includes a distal anchor means and a distal fulcrum means each disposed upon at least one of the plurality of walls and each distal to the fulcrum extension and proximal anchor means,
- wherein the distal fulcrum means is adapted to receive and hold a distal portion of a first side of the substrate so as to control the distal portion of the first side at a second support distance from the first wall,
- wherein the distal anchor means is adapted to receive and hold a distal portion of a second side of the substrate so as to control the distal portion of the second side at a second capture distance from the first wall, and
- wherein, the second capture distance and the second support distance are selected so as to cause the distal portion of the substrate to cantilever over distal fulcrum means so as to be fixedly held in flexion against the distal anchor means and the distal fulcrum means.

5. The ballast housing of claim 4, wherein the distal anchor means comprises a shear tab and wherein the distal fulcrum means comprises a gusset.

6. The ballast housing of claim 5, wherein the circuit extension comprises a jumper wire extending across a cavity disposed through the substrate,
- wherein the integral grounding means further comprises a yoke riser having the second engagement means disposed thereon and extending from one of the plurality of walls,
- wherein, with the circuit board installed in the ballast housing, the yoke riser is further adapted to extend through the cavity,
- wherein the second engagement means engages the jumper wire in electrical contact so as to provide electrical continuity between the jumper wire and the ballast housing, and
- wherein the proximal anchor means comprises a shear tab.

7. The ballast housing of claim 5, wherein the circuit extension comprises a jumper wire extending across the second side of the substrate,
- wherein the integral grounding means further comprises the second engagement means disposed upon an electrically conductive overhead tab disposed upon one of the plurality of walls and, with the circuit board installed in the ballast housing, extending above the second side of the substrate, the second engagement means receiving and holding the jumper wire in electrical contact, the second engagement means and the overhead tab adapted so as to provide electrical continuity between the jumper wire and the ballast housing, and
- wherein the overhead tab is disposed so as to comprise the proximal anchor means.

8. An electronic ballast comprising:
- a ballast housing having a plurality of walls including at least one electrically conductive wall, the ballast housing further comprising:
  - fulcrum means adapted to receive and hold a first side of the substrate, and
  - anchor means adapted to receive and hold a second side of the substrate;
- a circuit board including a substrate having a circuit disposed thereon, the circuit including a circuit grounding means;
- an electrically conductive coupler disposed upon at least one of the plurality of walls including at least one electrically conductive wall, the coupler having a first contact surface,
- wherein, the anchor means and the fulcrum means hold the substrate in flexion so as to press the circuit grounding means against the first contact surface of the coupler so as to provide electrical continuity between the circuit grounding means and the ballast housing;
- wherein the circuit board further comprises an alignment slot disposed in the substrate;
- wherein, the circuit grounding means includes a ground surface disposed upon a first side of the substrate;
- wherein the coupler comprises:
  - an alignment tab disposed upon one of the plurality of walls and adapted to receive and engage the alignment slot so as to provide alignment of the circuit card during installation, and
  - a grounding tab affixed to a first wall of the ballast housing, the grounding tab comprising a fulcrum extension having the first contact surface disposed thereon;
- wherein the fulcrum means includes the fulcrum extension adapted to support the first engagement means so as to control the ground surface at a first support distance from the first wall, adapted to receive and hold a proximal portion of a first side of the substrate so as to control the proximal portion of the first side at a first support distance from the first wall;
- wherein the anchor means comprises a proximal anchor means disposed upon a second wall of the ballast housing proximate to the grounding tab and adapted to receive and hold a proximal portion of a second side of the substrate so as to control the proximal portion of the second side at a first capture distance from the first wall; and
- wherein the first capture distance and the first support distance are selected so as to cause the substrate to cantilever over the fulcrum extension so as to be fixedly held in flexion against the proximal anchor means and the fulcrum extension.

9. The electronic ballast of claim 8, wherein the first contact surface comprises a serrated surface adapted to receive and hold the ground surface.

10. The electronic ballast of claim 8, wherein the anchor means and the fulcrum means further comprise, respectively:
- a distal anchor means and a distal fulcrum means, each disposed upon a portion of the ballast housing distal to the coupler,
- wherein the distal fulcrum means is adapted to receive and hold a distal portion of a first side of the substrate so as to control the distal portion of the first side at a second support distance from the first wall, wherein the distal anchor means is adapted to receive and hold a distal portion of a second side of the substrate so as to control the distal portion of the second side at a second capture distance from the first wall, and wherein the second capture distance and the second support distance are selected so as to cause the distal portion of the substrate to cantilever over distal fulcrum means so as to be fixedly held in flexion against the distal anchor means and the distal fulcrum means.

11. The ballast housing of claim 10, wherein the distal anchor means comprises a shear tab and wherein the distal anchor means comprises a gusset.

12. The ballast housing of claim 10, wherein the circuit extension comprises a jumper wire extending across a cavity disposed through the substrate, and wherein the coupler further comprises an electrically conductive yoke riser having a second contact surface disposed thereon and extending from one of the plurality of walls and through the cavity so as to engage the jumper wire in electrical contact with the second contact surface so as to provide electrical continuity between the jumper wire and the ballast housing.

13. The ballast housing of claim 10, wherein the circuit extension comprises a jumper wire extending across the second side of the substrate, and wherein the coupler further comprises an electrically conductive overhead tab having a second contact surface disposed thereon and extending from one of the plurality of walls so as to receive and hold the jumper wire in electrical contact with the second contact surface so as to provide electrical continuity between the jumper wire and the ballast housing.

14. The ballast housing of claim 13, wherein the overhead tab comprises at least a portion of the proximal anchor means.

15. An electronic ballast housing apparatus for housing a circuit board, the apparatus comprising:
   a resilient substrate including an electrical circuit and a ground surface thereon;
   a plurality of walls defining a region for housing the circuit board; and
   an electrically conductive coupler disposed on at least one of the plurality of walls, the coupler comprising:
      a grounding tab secured to and protruding from one of the plurality of walls, the grounding tab providing a rigid fulcrum engaging the substrate, the rigid fulcrum positioned for contacting the ground surface and imparting a static flexion force on the substrate when the substrate is installed in the housing, and
      an alignment tab extending from the grounding tab.

16. The apparatus of claim 15, wherein:
the coupler further comprises an overhead extension protruding from the alignment tab, the overhead extension including a hook extension protruding generally toward the grounding tab, the hook extension defining a space between the overhead extension and the grounding tab; and wherein the hook extension is longitudinally offset from the fulcrum nearer the alignment tab than the fulcrum.

17. The apparatus of claim 15, further comprising:
a jumper wire protruding laterally from the substrate oriented substantially perpendicular to the coupler, the jumper wire electrically connected to the circuit and comprising an electrically conductive material;
wherein the coupler further comprises a yoke riser extending from the grounding tab beyond the rigid fulcrum;
the substrate defining a yoke hole therein; and
wherein the yoke riser passes through the yoke hole and engages in electrical contact with the jumper wire.

* * * * *